United States Patent [19]

Takoshima

[11] Patent Number: 4,734,608
[45] Date of Patent: Mar. 29, 1988

[54] ELASTIC SURFACE WAVE ELEMENT

[75] Inventor: Takehiro Takoshima, Furukawa, Japan

[73] Assignee: Alps Electric Co., Ltd., Japan

[21] Appl. No.: 926,369

[22] Filed: Oct. 31, 1986

[30] Foreign Application Priority Data

Nov. 7, 1985 [JP] Japan ............................... 60-249790

[51] Int. Cl.$^4$ ............................................. H01L 41/08
[52] U.S. Cl. ................................ 310/313 R; 310/348; 310/344; 310/313 D
[58] Field of Search ............... 310/313, 340, 344, 348, 310/345, 346; 333/150–155, 193–196

[56] References Cited

U.S. PATENT DOCUMENTS

| 3,885,173 | 5/1975 | Lee | 310/345 X |
| 4,047,129 | 9/1977 | Ishiyama | 310/345 X |
| 4,451,754 | 5/1984 | Stolz et al. | 310/344 X |

FOREIGN PATENT DOCUMENTS

| 58-138115 | 8/1983 | Japan | 310/313 R |
| 513471 | 5/1976 | U.S.S.R. | 310/344 |

Primary Examiner—Mark O. Budd
Attorney, Agent, or Firm—Guy W. Shoup

[57] ABSTRACT

An elastic surface wave element which prevents mixture of foreign substances to improve the reliability thereof and allows a peripheral circuit for driving the element to be integrated with the element to facilitate designing and assembly of the element. The elastic surface wave element comprises an element body and a multi-layered printed circuit board disposed one on the other with a predetermined gap left therebetween and having terminal sections connected to each other. The element further comprises a sound wave absorbing member which seals outer peripheries along which the element body and the multi-layered printed circuit board are joined together and thus seals airtight a face of the element on which electrodes are formed.

5 Claims, 3 Drawing Figures

4,734,608

ELASTIC SURFACE WAVE ELEMENT

BACKGROUND OF THE INVENTION

This invention relates to an elastic surface wave element which can be applied as a delay line, an oscillator, a filter and the like.

Elastic surface wave elements were once used for special military applications, but in recent years, they have been gradually used also for machines and apparatus for public welfare such as FM tuners and TV sets, and attention has been suddenly paid to such elements. Elastic surface wave elements are now put on the market typically as delay elements, oscillators and filters. Characteristics of those various elastic surface wave elements are that they are small in size, light in weight, high in reliability, and high in mass-productivity with their production steps resembling those of integrated circuits. Therefore, at present days, those elastic surface wave elements are produced in a large quantity as essential electronic parts.

A typical one of such conventional elastic surface wave elements is an elastic surface wave resonator wherein a comb-shaped electrode made of a conductive substance is formed on a piezo-electric substrate and a pair of grid-formed reflectors composed of ridges including a dielectric, a conductor, and a groove are formed on opposite sides of the comb-shaped electrode. As a voltage of a particular frequency is applied to the comb-shaped electrode, an electric field is applied to a surface of the piezo-electric substrate in gaps of the comb-shaped electrode so that distortions which are proportional to the voltage applied to the electrode are caused to appear there due to the piezo-electric feature of the piezo-electric substrate. Such distortions make sound waves which are determined depending upon a material of the piezo-electric substrate and propagate in opposite directions as surface waves. The surface waves are reflected by the reflectors on opposite sides of the electrode and thus returned to the comb-shaped electrode whereby to cause resonances.

Such various elastic surface wave elements are commonly sealed in metal containers called hermetic seals in order to shut noise signals from outside. Such hermetic seals are normally plated with nickel or a like metal in order to improve sealing and anti-corrosive properties of the elements.

However, such elastic surface wave elements sometimes suffer from a short-circuiting phenomenon between electrodes which is caused by adhesion to a comb-shaped electrode of a foreign conductive substance mixed thereto before sealing of a hermetic seal or of an exfoliated piece of the plated material from a hermetic seal. Consequently, a trouble that the electric impedance is changed or some other trouble may be caused, resulting in deterioration in reliability of the elastic surface wave element and in reduction in mass productivity.

Meanwhile, a Japanese laid-open Patent No. 59-3957 discloses an invention of an electronic part package wherein an oscillator is carried on a substrate and a case is sealed airtight on the oscillator. Further, a Japanese laid-open utility model No. 53-78935 discloses an elastic surface wave element wherein a layer of solder is provided around a face of a piezo-electric substrate on which an electrode is formed while another layer of solder is provided around a plate-formed member having a lead wire for the electrode and the piezo-electric substrate and the plate-formed member are placed one on the other and adhered to each other.

However, in those elastic surface wave elements, because a face on which an electrode is formed is sealed airtight by a case or a plate-formed member, a peripheral circuit must be provided on a separate board.

SUMMARY OF THE INVENTION

It is an object of the present invention to provide an elastic surface wave element which prevents mixture of foreign substances thereto to improve the reliability thereof and allows a peripheral circuit for driving the element to be integrated with the element to facilitate designing and assembly of the element.

According to the present invention, there is provided an elastic surface wave element, comprising an element body including a piezo-electric substrate and at least one pair of comb-shaped electrodes on the piezo-electric substrate, a multi-layered printed circuit board disposed on a face of the element body on which the electrodes are formed with a predetermined gap left therebetween while terminal sections of the element body and the multi-layered printed circuit board are connected to each other, and a sound wave absorbing member for sealing outer peripheries along which the element body and the multi-layered printed circuit board are joined together.

Since a face of an elastic surface wave element on which electrodes are formed is sealed airtight using a multi-layered printed circuit board, mixture of foreign substances can be prevented, thereby improving the reliability of the element, and a peripheral circuit for the element can be formed on the multi-layered printed circuit board, thereby facilitating designing and assembly of elastic surface wave elements.

According to a preferred form of the invention, the terminal sections of the element body and the terminal sections of the multi-layered printed circuit board are connected to each other by way of a layer of solder along a joining plane. Thus, the terminal sections are connected assuredly to each other by the layer of solder, and the heat resisting property of the element can be improved because the layer of solder will absorb a stress of the element arising from thermal expansion of the element.

The predetermined gap between the element body and the multi-layered printed circuit board may be provided either by the layer of solder or by the sound wave absorbing member.

According to another preferred form of the invention, the sound wave absorbing member is made of either a synthetic resin material or a synthetic rubber material. Thus, the element body and the multi-layered printed circuit board can be joined together easily by the sound wave absorbing member, and useless sound waves are absorbed by the sound wave absorbing member, which further improves the accuracy of the element.

DESCRIPTION OF THE PREFERRED EMBODIMENTS

Figure 1:
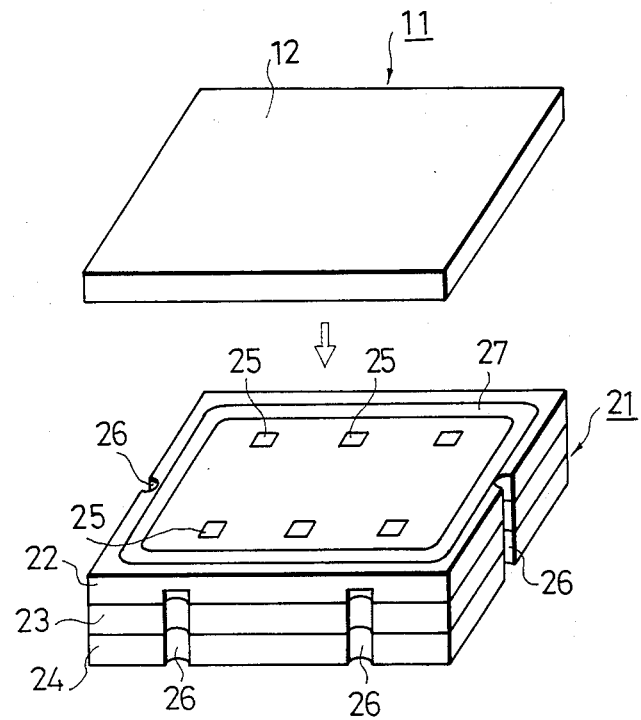
FIG. 1 is a fragmentary perspective view of an embodiment of an elastic surface wave element according to the present invention.
Figure 2:
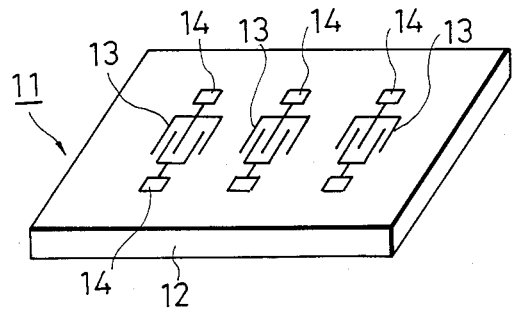
FIG. 2 is a perspective view of an element body for use with the elastic surface wave element of FIG. 1.

Referring first to FIGS. 1 and 2, there is illustrated an embodiment of an elastic surface wave element according to the present invention.

The elastic surface wave element includes an element body 11 and a multi-layered printed circuit board 21. The element body 11 has a plurality of comb-shaped electrodes 13 formed on a surface of a piezo-electric substrate 12 and each having a terminal section 14 as shown in FIG. 2. Meanwhile, the multi-layered printed circuit board 21 includes a plurality of, three in the present embodiment, substrates 22, 23 and 24 which are placed one on another. Terminal sections 25 are formed on a surface of the uppermost substrate 22 in a corresponding relationship to the terminal sections of the element body 11. The other substrates 23 and 24 have individually formed thereon circuit patterns not shown such as, for example, for a tuning or matching circuit which constitutes a peripheral circuit. A plurality of semicircular through-holes 26 are formed on side end faces of the multi-layered printed circuit board 21 and are adapted to be connected to terminal pins or the like of an external circuit board not shown. The multi-layered printed circuit board 21 is covered along peripheral edges of the top face thereof with a film 27 of a synthetic rubber or resin material such as, for example, silicone rubber or epoxi resin. Thermosetting and thermoplastic resin materials can both be used for the synthetic rubber or resin film 27. On the other hand, solder is applied to the terminal sections 14 and 25 but not shown in the drawings. Thus, an elastic surface wave element is constituted by relatively positioning and adhering a face of the element body 11 on which the comb-shaped electrodes 13 are formed to a face of the multi-layered printed circuit board 21 on which the terminal sections 24 are formed. In this case, the terminal sections 14 and 25 are opposed to each other, and solder is melted by thermal adhesion or infrared-ray heating to solder the terminal sections 14 and 25 to each other. Thus, the terminal sections 14 and 25 are electrically connected and mechanically bonded together. Then, the element body 11 and the multi-layered printed circuit board 21 are sealed by the synthetic rubber or resin film 27. The element body 11 and the multi-layered printed circuit board 21 are held in a spaced apart relationship from each other by a predetermined gap either by a layer of the solder or by the synthetic rubber or resin layer 27. Such a gap may be maintained alternatively by a spacer or projections provided on the multi-layered printed circuit board 21. Or otherwise, the gap can be provided by the thickness of the terminal sections 14 and 25.

In the present elastic surface wave element, the element body 11 and the multi-layered printed circuit board 21 are joined together and sealed airtight. Accordingly, it can be made compact in size and a foreign substance can be prevented from sticking to a face of a comb-shaped electrode 13, resulting in improvement in reliability. Besides, by forming a peripheral circuit on the multi-layered printed circuit board 21, designing and assembly for incorporation of the element into an external circuit can be facilitated. In addition, since peripheral edges of the elastic surface wave element are sealed airtight with the synthetic rubber or resin layer 27, useless sound waves can be absorbed so that the accuracy can be improved.

Figure 3:
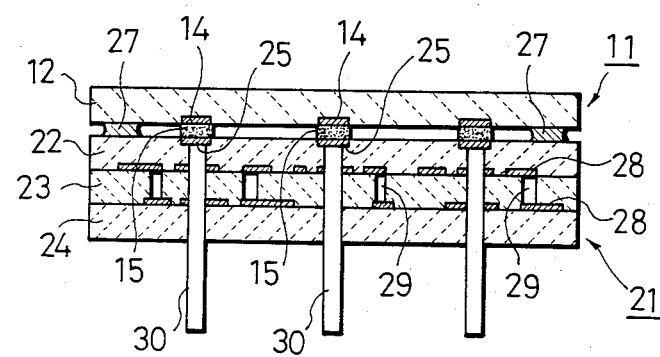
FIG. 3 is a cross sectional view showing another embodiment of an elastic surface wave element according to the invention.

Reference is now had to FIG. 3 in which another embodiment of an elastic surface wave element according to the present invention is shown. It is to be noted that like parts are denoted by like reference numerals to those of FIGS. 1 and 2 and description thereof is omitted herein.

The elastic surface wave element includes terminal pins 30 for connection with an external circuit. The terminal pins 30 are inserted in through-holes of a multi-layered printed circuit board 21 and connected to an internal circuit and have lower ends projected downwardly from a bottom face of the multi-layered printed circuit board 21. It is to be mentioned that while in the present embodiment top ends of the terminal pins 30 are directly connected to terminal sections 25, the terminal pins 30 may be connected alternatively by way of an internal circuit. Circuit patterns constituting a peripheral circuit are formed on substrates 22, 23 and 24 of the multi-layered printed circuit board 21 and are connected to each other by way of through-holes 29 which extend through the circuit board 21. A layer 15 of solder connects terminal sections 14 of an element body 11 to terminal sections 25 of the multi-layered printed circuit board 21.

While in each of the embodiments described above a layer of solder is used for connection between the terminal sections 14 of the element body 11 and the terminal sections 25 of the multi-layered printed circuit board 21, where the terminal sections 14 and 25 are made, for example, of aluminum or gold, the terminal sections 14 and 25 can be thermally adhered directly to each other, or else they may be only contacted with each other. It is to be mentioned that only about 1 μm or more is sufficient for the gap between the element body 11 and the multi-layered printed circuit board 21.

What is claimed is:
1. An elastic surface wave element comprising:
    a piezoelectric substrate having at least one pair of comb-shaped electrodes connected to respective first terminal sections having a certain thickness on a lower planar surface of said substrate;
    a multi-layered printed circuit board having second terminal sections provided on an upper planar surface thereof which have a certain thickness and correspond in position to said first terminal sections,
    wherein said lower planar surface of said substrate is disposed facing said upper planar surface of said printed circuit board spaced therefrom by a predetermined gap, and said first terminal sections are electrically connected and mechanically bonded to said second terminal sections by a joining layer applied between each pair of corresponding terminal sections, said predetermined gap being provided by the thicknesses of said first terminal sections joined to said second terminal sections; and
    a sound wave absorbing layer provided sealingly in the predetermined gap around an outer periphery of said substrate and said printed circuit board joined together.
2. An elastic surface wave element according to claim 1, wherein said terminal sections of said substrate and said multi-layered printed circuit board are connected to each other by way of a layer of solder along a joining plane.

3. An elastic surface wave element according to claim 2, wherein said predetermined gap between said element body and said multi-layered printed circuit board includes said layer of solder.

4. An elastic surface wave element according to claim 1, wherein said predetermined gap between said substrate and said multi-layered printed circuit board includes by said said sound wave absorbing layer.

5. An elastic surface wave element according to claim 4, wherein said sound wave absorbing layer is made of a synthetic resin or rubber material.

* * * * *